US006887332B1

(12) United States Patent
Kagan et al.

(10) Patent No.: US 6,887,332 B1
(45) Date of Patent: May 3, 2005

(54) PATTERNING SOLUTION DEPOSITED THIN FILMS WITH SELF-ASSEMBLED MONOLAYERS

(75) Inventors: Cherie R. Kagan, Ossining, NY (US); Tricia Lynn Breen, Tarrytown, NY (US); Laura Louise Kosbar, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/556,952

(22) Filed: Apr. 21, 2000

(51) Int. Cl.$^7$ .............................. B44C 1/16; B05D 5/12; C03C 15/00; C03C 25/68; H01L 21/30
(52) U.S. Cl. .................. 156/230; 156/232; 156/242; 427/96; 427/261; 428/914; 216/49; 438/738
(58) Field of Search ................................ 156/230, 232, 156/240, 242, 247, 270; 427/96, 256, 258, 259, 261, 272, 146, 147; 428/200, 212, 408, 914; 216/41, 47, 48, 96, 100; 438/738

(56) References Cited

U.S. PATENT DOCUMENTS

| | | | |
|---|---|---|---|
| 4,916,115 A | 4/1990 | Mantese et al. ................ 505/1 |
| 4,952,556 A | 8/1990 | Mantese et al. ................ 505/1 |
| 5,059,258 A | * 10/1991 | Wefers et al. ................ 148/272 |
| 5,512,131 A | 4/1996 | Kumar et al. ............. 156/655.1 |
| 5,620,850 A | 4/1997 | Bamdad et al. .............. 530/300 |
| 5,900,160 A | 5/1999 | Whitesides et al. ............ 216/41 |
| 6,020,047 A | 2/2000 | Everhart ..................... 428/209 |

OTHER PUBLICATIONS

*Organic–Inorganic heterostructure electroluminescent device using a layered perovskite semiconductor $(C_6H_5C_2H_4NH_3)_2PbI_4$*, Era et al. in Appl. Phys Lett. 65 (6), Aug. 8, 1994 pp. 676–678.
*Manipulation of the Wettability of Surfaces on the 0.1– to 1–Micrometer Scale through Micromachining and Molecular Self–Asembly* by Abbott et al., in Science, vol. 257, Sep. 4, 1992, pp. 1380–1382.
*Maskless photolithography: Embossed photoresist as its own optical element* by Paul et al., in Applied Physics Letters, vol. 73, No. 20, Nov. 16, 1998, pp. 2893–2895.
*Patterning of dielectric oxide thin layers by microcontact printing of self–assembled monolayers* by Jeon et al. in J. Mater. Res., vol. 10, No. 12, Dec. 1995, pp. 2996–2999.

* cited by examiner

*Primary Examiner*—J. A. Lorengo
(74) *Attorney, Agent, or Firm*—Ohlandt, Greeley, Ruggiero & Perle, L.L.P.; Daniel P. Morris

(57) ABSTRACT

The present invention provides a method of forming a patterned thin film on a surface of a substrate having thereon a patterned underlayer of a self-assembled monolayer. The method comprises depositing a thin film material on the self-assembled monolayer to produce a patterned thin film on the surface of the substrate. The present invention further provides processes for preparing the self-assembled monolayer. The present invention still further provides solution-based deposition processes, such as spin-coating and immersion-coating, to deposit a thin film material on the self-assembled monolayer to produce a patterned thin film on the surface of the substrate.

9 Claims, 4 Drawing Sheets

PATTERNING SOLUTION DEPOSITED THIN FILMS WITH SELF-ASSEMBLED MONOLAYERS

BACKGROUND OF THE INVENTION

1. Field of the Invention

The present invention relates generally to the patterning of a thin film on a surface. More particularly, the present invention relates to a method of depositing by a solution-based technique a patterned thin film onto a surface that has been selectively patterned with a self-assembled molecular monolayer.

2. Description of the Prior Art

Solution-based thin film deposition processes, such as spin-coating and immersion-coating, i.e., dip-coating, provide simple, low-cost, low-temperature routes to thin film deposition on large-area solid substrates.

Spin-coating and dip-coating are long-tested techniques commonly used to deposit thin films of a wide variety of materials for a broad range of applications. These materials include, as examples, organic materials, such as small molecules, oligomers, polymers, and photoresists; organic-inorganic hybrid materials; soluble inorganic materials, such as salts; suspensions; dispersions, such as silica particles or nanocrystalline materials; and metallo-organic complexes. The metallo-organic complexes may be converted to inorganic materials upon decomposition during high temperature annealing, a process known as "metal organic deposition."

The above thin film materials are metallic, semiconducting, insulating and superconducting. They are used in many optical, electrical, magnetic, and structural applications.

U.S. Pat. Nos. 4,916,115 and 4,952,556, both to Mantese et al., describe patterning techniques. Thus, U.S. Pat. No. 4,916,115 describes techniques used to pattern spin-coated metallo-organic thin films by locally pyrolyzing deposited molecules. U.S. Pat. No. 4,952,556 describes techniques used to pattern spin-coated metallo-organic thin films by locally decomposing spin-coated metallo-organic thin films to form patterned insoluble inorganic materials upon dissolving remaining metallo-organics in an organic solvent.

U.S. Pat. No. 5,512,131 to Kumar et al. describes a method of patterning a surface that employs microcontact printing, also known as "stamping," to form patterned molecular monolayers on the surface of a substrate.

U.S. Pat. No. 5,620,850 to Bamdad et al. describes microcontact printing, which has been used to deposit self-assembled monolayers (SAM) that have tail groups to sense biological materials.

N. L. Abbott et al., Science, 257, 1380(1992) describes the use of self-assembled monolayers (SAM) that have tail groups to control the placement of liquids on surfaces.

U.S. Pat. No. 6,020,047 to Everhart et al. describes the use of self-assembled monolayers (SAM) that have tail groups as indicators of analytes.

U.S. Pat. No. 5,900,160 to Whitesides et al. describes the use of patterned monolayers as masks for etching thin films.

N. J. Jeon et al., J. Mater. Res., 10(12), 2996(1995) describes the use of microcontact printing to prepare patterned metal-oxide thin films deposited from sol-gel precursors.

M. Era et al., Appl. Phys. Lett., 65, 676(1994) describes organic-inorganic hybrid materials that form the emissive layers in light-emitting diodes.

K. E. Paul et al., Appl. Phys. Lett., 73, 2893(1998) describes exposure of patterned photoresist features to UV radiation.

The contents of all of the above patents and publications are incorporated herein by reference in their entirety.

For many applications, thin films must be patterned to provide control over the film's spatial geometry. Spin- and dip-coated thin films have been patterned by subtractive processes, such as photolithography, etching, e-beam, ion-beam, or laser beam techniques and their combinations.

Etching spin- or dip-coated thin films exposes the deposited material to potentially harsh etching solutions or environments and may degrade the desirable materials properties (e.g., electrical, optical, magnetic, or structural) of the thin film.

Etching also requires multiple processing steps making it both more complex and costly. For example, using photolithography to define etch pattern requires photoresist to be applied, exposed to radiation, and developed before etching the material. In a final step, the remaining photoresist may be removed.

Interaction between the thin film material and the resist, radiation, or solvents/developer used in the lithography process may also degrade the deposited thin film. Accordingly, e-beam, ion-beam, or laser beam techniques are another set of alternative routes to patterning thin films.

These focused beam techniques are serial "writing" processes that are slow and therefore inherently more costly when large areas of the film must be modified. In addition, E-beam and ion-beam techniques must be carried out in vacuum chambers.

These techniques have been used, for example, to pattern spin-coated metallo-organic thin films by locally pyrolyzing deposited molecules, as described in the previously incorporated U.S. Pat. No. 4,916,115, and by locally decomposing spin-coated metallo-organic thin films to form patterned insoluble inorganic materials upon dissolving remaining metallo-organics in an organic solvent, as described in the previously incorporated U.S. Pat. No. 4,952,556.

These applications of focused beams to pattern thin films can lead to redeposition of undesirable materials, in the case of pyrolysis, and to possible material degradation by solvents used to remove the remaining metallo-organics, in the case of local decomposition.

In general, lithographic and focused beam techniques all require the use of a relatively complicated and costly apparatus to prepare patterned thin films. Resists, solvents, and developer used in these processes are also consumed, thus producing undesirable waste.

Alternative routes have been explored to deposit patterned thin films by low cost solution processes. All of these alternative techniques, notably ink-jet printing, screen-printing, and micromolding described herein below, have only been tested for a limited number of materials systems, each giving rise to a variety of limitations.

Thus, ink-jet printing is a sequential deposition technique, making it slow and therefore, more costly. It also has limited resolution caused by the spreading of the printed solution over the solid substrate surface. Furthermore, it can be limited by the viscosity and flow properties of the printed solution.

In the screen-printing method, thin films are deposited by spreading a solution of material over a screen in contact with the solid substrate surface. As in ink-jet printing, screen-printing is typically limited to low resolution applications by the inability to define high resolution features in the screen mask and by restrictions on the viscosity and flow properties of the printed solution.

Micromolding in capillaries is a technique in which an interconnected system of recessed channels, formed by placing a topographically modulated elastomeric stamp in contact with a substrate surface, is filled by capillary action on a drop of fluid containing the pre-polymer into a channel at one edge of the stamp. The pre-polymer is cured and the stamp is removed from the substrate surface, leaving an interconnected system of microstructures.

Micromolding in capillaries is slow and can be advantageously used only with solvents that (1) have low viscosity and (2) do not swell the stamp elastomer. This approach is further limited to patterning relatively large, micron-size features over small patterned areas. The pattern is restricted by the channel structure to extend to the edges of the stamp and to form interconnected and not isolated microstructures.

Microtransfer molding is a related technique in which a fluid pre-polymer is filled in indentations of a topographically modulated elastomeric stamp, is transferred to the substrate by bringing the stamp and substrate into conformal contact, and is cured to form a solid, allowing the stamp to be removed. As above, microtransfer molding is limited to large feature sizes and to materials that do not swell the stamp. An additional problem with this technique is the formation of an undesirable thin layer of material in regions where the stamp and the substrate surface make contact.

Thus, a need exists in the art for a simple, low-cost, low-temperature route to patterning thin films that are deposited by the well-developed and broadly applied solution deposition techniques, such as spin- and dip-coating, which route does not require potentially damaging post-deposition processing of these thin film materials.

SUMMARY OF THE INVENTION

It is an object of the present invention to provide a low-cost method of forming a patterned thin film on a surface of a substrate having thereon a patterned underlayer of a self-assembled monolayer.

It is another object of the present invention to provide solution-based deposition processes for depositing a thin film material on a self-assembled monolayer to produce a patterned thin film on the surface of the substrate.

It is a further object of the present invention to provide a method of forming a patterned thin film on a surface of a substrate without potentially damaging post-deposition processing.

Accordingly, the present invention provides low-cost method of forming a patterned thin film comprising: depositing a thin film material on a surface of a substrate having thereon a patterned underlayer of a self-assembled monolayer.

The present invention further provides processes for preparing the self-assembled monolayer as well as solution-based deposition processes, such as, spin-coating and immersion-coating, for depositing a thin film material on a substrate having a patterned self-assembled monolayer to produce a patterned thin film on the surface of the substrate.

DETAILED DESCRIPTION OF THE INVENTION

Figure 1A:
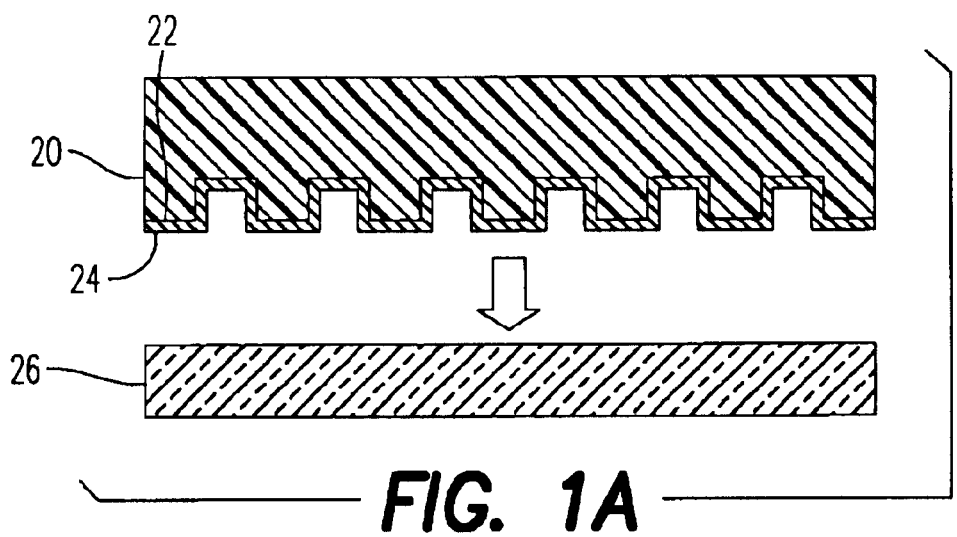
FIG. 1A illustrates an elastomeric stamp with indentations coated with a molecular species before contacting a substrate.

The present invention employs a patterned underlayer of a self-assembled molecular monolayer to selectively deposit, by solution based techniques, thin film materials on a solid substrate.

The self-assembled monolayer (SAM) according to the present invention comprises organic molecular species having functional head groups that bind to the particular solid substrate surface and tail groups that affect the wettability of the particular solution deposited thin films.

For example, solution deposited thin films can be obtained using one of the solution based techniques, such as spin- or immersion-coating, i.e., dip-coating. In the case of spin-coating, the self-assembled monolayer patterned substrate is flooded with a solution containing the thin film material or its precursors and then spun to form a continuous or discontinuous thin film in a pattern defined by the self-assembled monolayer or its inverse. In the case of immersion-coating, the self-assembled monolayer patterned substrate is immersed in solution containing the thin film material or its precursors and then withdrawn from the solution to form a continuous or discontinuous thin film in a pattern defined by the self-assembled monolayer or its inverse. In both of these cases, the solvent typically evaporates spontaneously, thereby forming the thin film. However, the rate of evaporation can be accelerated by providing one or more methods known in the art, such as, heat, reduced pressure, ventilation, and the like. By proper choice of concentration of material in solution, the casting solvent, the rate of revolution for spin-coating or the rate of substrate removal for dip-coating, the desired film thickness can be obtained.

The present invention includes a simple, low-cost, low-temperature process that allows large areas of a substrate to be patterned in parallel without the need for post-deposition processing. Such post-deposition processing, as shown for other techniques, may have an adverse effect on the properties of the remaining thin film, thereby limiting their applications. The present invention provides a method of depositing patterned thin films on a variety of substrates of various shapes, including irregularly shaped substrates.

As a substrate, any suitable material can be used. Suitable substrates include, for example, a metal, a metal oxide, a semiconductor, a metal alloy, a semiconductor alloy, a polymer, an organic solid, and a combination thereof. They can be flexible or inflexible solid substrates, having a curved or planar geometry, depending on the requirements of a desired application.

The deposition, formation, and properties of self-assembled monolayers (SAM) are active areas of scientific research. Monolayers of molecules are chosen with functional head groups that selectively bind to particular solid substrate surfaces and tail groups that pack and interact with their neighbors to form relatively ordered molecular monolayers.

Suitable molecular species that can form a self-assembled monolayer include organic molecular species having:

(1) a head functional group capable of interaction with the surface of the substrate forming a coated surface; and (2) a tail group for chemical differentiation of the patterned and unpatterned regions of the coated surface.

Examples of the functional head groups that can be designed into organic molecules for interacting with or binding to a particular substrate surface with chemical specificity include one or more of the same or different functional groups, such a phosphine, phosphonic acid, carboxylic acid, thiol, epoxide, amine, imine, hydroxamic acid, phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithlocarboxylate, xanthate, thioxanthate, alkylthiophosphate, dialkyldithiophosphate or a combination thereof. Preferred organic compounds having head groups suitable for use as the molecular species that can form a self-assembled monolayer include:

(1) silanes, phosphonic acids, carboxylic acids, and hydroxamic acids, which can bind to metal oxide surfaces such as silicon dioxide, aluminum oxide, indium zinc oxide, indium tin oxide and nickel oxide; and (2) thiols, amines and phosphines, which can bind to metal substrates such as gold, silver, palladium, platinum and copper and to semiconductor surfaces such as silicon and gallium arsenide.

The tail groups can be any of the head groups, as well as a hydrocarbon, a partially halogenated hydrocarbon, a fully halogenated hydrocarbon or a combination thereof. The hydrocarbon or the halogenated hydrocarbon can be purely aliphatic or aromatic or can have a combination of aliphatic and aromatic groups. The halogen in the partially or fully halogenated hydrocarbon can be one or more of the following: fluorine, chlorine, bromine or iodine. Preferably, the partially or fully halogenated hydrocarbon is a partially or fully fluorinated hydrocarbon or a chlorofluorocarbon.

The self-assembled monolayer forms as molecules pack on and interact with the surface of solid substrate upon contact. For example, contacting can be achieved by immersing a substrate into a solution containing the desired, surface derivatizing molecular species and withdrawing the substrate.

A monolayer can also be transferred to the surface of a substrate by dipping the substrate through a layer of molecules packed on the liquid surface of a Langmuir-Blodgett trough.

These self-assembled monolayers can be altered by exposure to radiation. For example, irradiation photochemically modifies and/or removes molecules assembled on the substrate surface. Thus, irradiating the self-assembled monolayer with a patterned radiation through a mask, such as, for example, a photomask, selectively modifies exposed molecules, producing a patterned, chemically differentiated, substrate surface. Although discussed in the context of selectively masking the output of the radiation source, in some embodiments a direct writing technique can be used to direct the radiation to desired regions to form the patterned, chemically differentiated, substrate surface.

Alternatively, microcontact printing, also known as "stamping," can be used to form patterned molecular monolayers on substrate surfaces. This well-developed route to form patterned surfaces is described in the previously incorporated U.S. Pat. No. 5,512,131.

In one embodiment, a stamp, such as an elastomeric stamp, is coated with an organic molecular species that interacts with or binds to the particular solid substrate. The coated stamp is brought into contact with and then removed from the solid substrate surface, thereby transferring a monolayer of molecules to the solid substrate surface.

Microcontact printing is a dry printing technique that typically does not swell the stamp as in the case of micromolding.

Preferably, an elastomeric stamp is used to pattern planar, curved, irregularly shaped, and flexible solid substrates.

Preferably, irradiative patterning or microcontact printing is used to define patterned self-assembled monolayers prior to thin film deposition, for example, using a solution-based process, such as spin- or dip-coating.

The organic underlayer acts to chemically differentiate the substrate surface, for example providing hydrophobic versus hydrophilic regions, affecting the wettability and deposition of the solution deposited thin film.

In one embodiment of the present invention, a spin-coating process is used. In this process, the self-assembled monolayer patterned substrate is flooded with a solution containing a thin film material, or a precursor of thin film material, and spun to deposit the thin film material to form a patterned thin film on the substrate.

In another embodiment of the present invention, an immersion-coating process, also known as dip-coating, is used. In this process, the self-assembled monolayer patterned substrate is immersed into a solution of the thin film material, or a precursor, withdrawing the substrate from the solution to deposit the thin film material to form a patterned thin film on the substrate.

The tail groups in the patterned organic underlayer differentiate the patterned and unpatterned regions of the substrate. Upon spinning or removing the substrate from the dipping solution, a continuous or discontinuous thin film, patterned in the geometry of the self-assembled monolayer or its inverse, as the case may be, depending on the chemical nature of the self-assembled monolayer and the thin film material, is deposited.

According to the present invention, large areas can be patterned in parallel, without the need for further post-deposition processing and thus, eliminating potentially damaging additional processing steps.

The present invention enables a wide variety of materials including insulators, semiconductors, metals, and superconductors to be deposited from solution as patterned thin films. Examples of materials include organic molecules, oligomers, polymers and photoresists; organic-inorganic hybrid materials; soluble inorganic materials such as salts;

dispersions such as silica particles and nanocrystalline materials; and metallo-organic complexes that may be converted to metals or metal oxides upon high temperature annealing.

Examples of applications of these materials include: insulators in electrical applications and gate insulators in transistors, for example, prepared from organic polymers such as polyimide and polymethyl methacrylate or from metal oxides upon conversion of metallo-organics; semiconductors that form the emissive layer in light emitting diodes, the conductive channel in thin film transistors, and the photoconductive layer in photovoltaic devices, for example, prepared from conjugated organic small molecules, oligomers, polymers, and organometallic complexes, organic-inorganic hybrid materials, and nanocrystalline materials; metals that act as electrical wiring or contacts, for example, made from organic conductors such as polyaniline or annealed organometallics or metal particles yielding conductive metals or metal-oxides; and superconductors, for example, prepared by metallo-organic deposition from metallo-organic precursors to form $YBa_2Cu_3O_7$.

Optical applications include the deposition of lenses and microlenses, for example from polymers or silica particles; waveguiding structures, for example from metallo-organic deposition of $LiNbO_3$, and photonic band gap structures, from silica or high refractive index particles.

These materials have mechanical properties that make them useful in structural applications.

Metallo-organic deposition and conversion of metal oxides can be used to form ferroelectric materials, for example, for memory applications; piezoelectric materials; dielectric materials, for example, for capacitor structures; and magnetic materials, for example for magnetoresistive applications.

Metallo-organic deposition (MOD) is a process commonly used to prepare a wide variety of inorganic films by wet chemical techniques using relatively low temperatures. MOD avoids the use of vacuum or gel processes. Metallo-organic compounds containing the desired metallic elements are dissolved in appropriate quantities in a solvent to form a solution, which is then used to produce a thin film having a pre-selected stoichiometry. The solution is applied to the substrate by a solution process, such as spin-coating or immersion-coating. The "wet" film is heated to remove solvent and decompose the metallo-organic compound, thereby producing an inorganic film. These films can be further annealed in appropriate environments to produce and/or control specific properties, such as, for example, oxygen stoichiometry, grain size, and grain orientation.

The present invention can also be used in a hybrid lithographic technique to reduce processing time and cost by using the method of the present invention to define larger scale features in photoresists in combination with more expensive, for example, e-beam lithography, used to pattern small-scale features.

The method according to the present invention includes the step of depositing a thin film material on the self-assembled monolayer to produce a patterned thin film on the surface of the substrate.

Referring to FIG. 1A, elastomeric stamp 20 is prepared, for example from polydimethylsiloxane, with at least one indentation. The topographically modulated surface of the elastomeric stamp 20 is coated over the entire surface of the stamp 22 with organic molecular species 24.

Molecules 24 are chosen with functional head groups that bind to the particular solid substrate surface 26. Such molecules include compounds, such as, silanes, phosphonic acids, carboxylic acids, and hydroxamic acids, which can bind to a metal oxide surface, and thiols, amines, and phosphines, which can bind to metal and semiconductor surfaces.

Figure 1B:
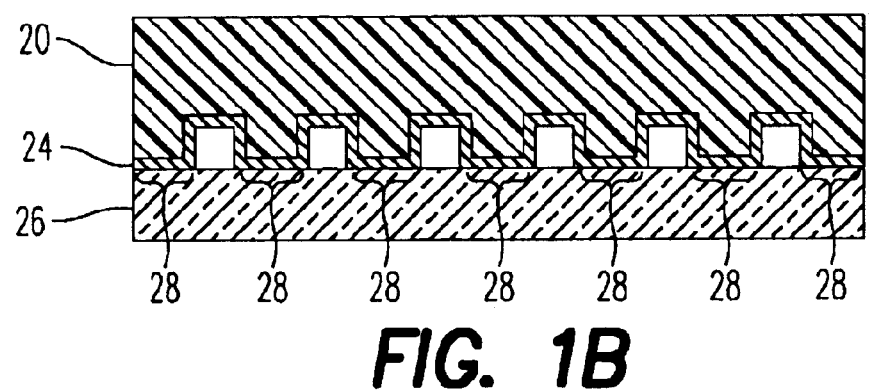
FIG. 1B illustrates an elastomeric stamp placed adjacent to the substrate such that the stamping surface contacts the substrate surface.

Referring to FIG. 1B, the elastomeric stamp 20 is placed in a predetermined orientation, adjacent to the substrate 26 such that only the stamping surface 28 contacts the substrate surface 26. The elastomeric stamp 20 is held in contact with the substrate surface 26 allowing the organic molecular species to transfer to the substrate surface 26.

Figure 1C:
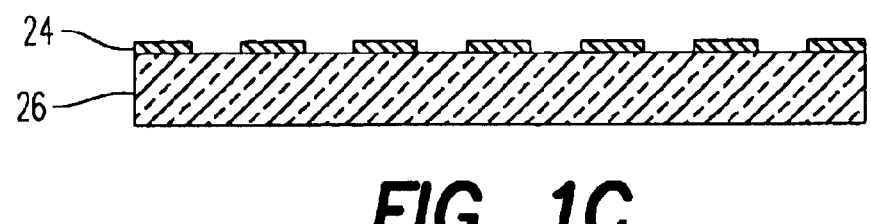
FIG. 1C shows the molecular species transferred to the solid substrate surface as a self-assembled monolayer after the elastomeric stamp is removed.

FIG. 1C shows monolayer 24 transferred to the solid substrate surface 26 after the elastomeric stamp 20 is removed.

A self-assembled molecular monolayer 24 is transferred to the solid substrate surface 26 only in the regions 28 where the elastomeric stamp 20 is brought into contact with the solid substrate surface 26. Regions of the substrate surface 26 not contacted by the elastomeric stamp 20 remain free of molecular species 24. Thus, the topography of the elastomeric stamp 20 defines the pattern of the self-assembled molecular monolayer 24 on the solid substrate surface 26.

Choice of the tail group of the stamped molecular species 24 modifies the chemical nature of the substrate surface 26. Thus, subsequent solution deposition of the thin film will be determined by the chemical nature of the tail group and surface characteristics of the substrate.

Figure 2A:
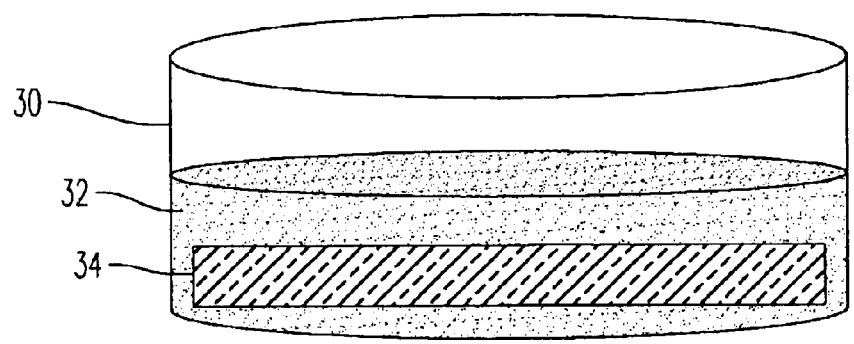
FIG. 2A illustrates a dish filled with a solution of surface derivatizing molecular species and a solid substrate immersed in the solution.

Referring to FIG. 2A, dish 30 filled with a solution of the desired surface derivatizing molecular species 32 can be seen. The solid substrate 34 is immersed in the solution of molecules 32 for a time period long enough to allow the organic molecular species of the molecules in solution 32 to come into contact with, bind to and pack on the substrate surface 34, forming a self-assembled molecular monolayer 40.

Figure 2B:
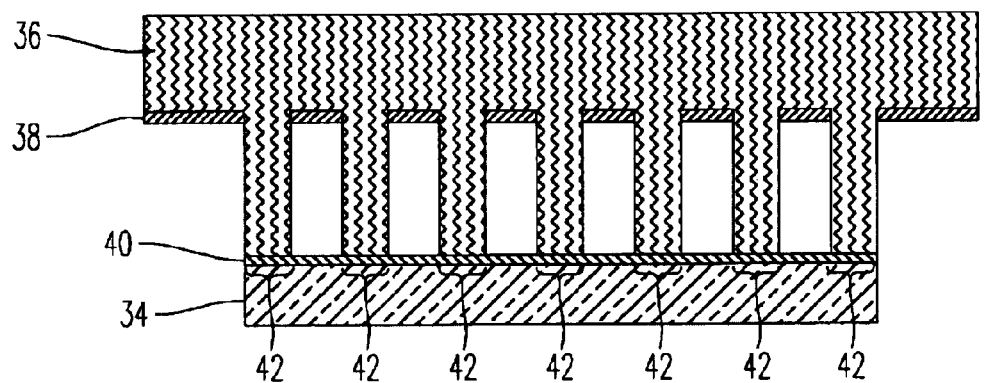
FIG. 2B illustrates irradiation of a self-assembled molecular monolayer using a mask.

Referring to FIG. 2B, radiation 36 is spatially modulated in intensity using a mask 38. The self-assembled molecular monolayer 40 is exposed to the radiation 36 only in regions 42 defined by the transparent regions in the mask 38. The self-assembled molecular monolayer 40 absorbs the incident radiation 36, such as light. Irradiation with light photochemically modifies and/or removes the exposed self-assembled molecular layer 40 in regions 42.

Figure 2C:
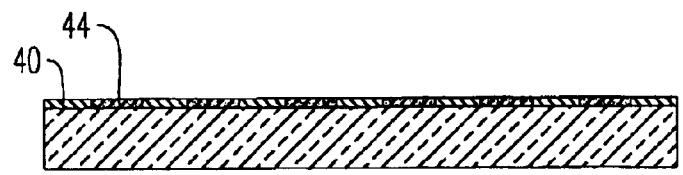
FIG. 2C illustrates a chemically differentiated surface modified to a discontinuous pattern.

Referring to FIG. 2C, it is seen that local photochemistry, defined by the pattern of the mask 38, has modified the self-assembled molecular monolayer in regions 42 shown in FIG. 2B to produce the chemically distinct surface 44. The chemically differentiated surface 44 is in contrast to the chemical nature of the original molecular monolayer 40, which now has a discontinuous pattern.

The self-assembled molecular monolayers, deposited and defined by the examples of microcontact printing and self-assembly/irradiative patterning, provide chemical differentiation between patterned and unpatterned regions of the substrate surface that affect the wettability and therefore the subsequent deposition thereon, by solution based techniques, of patterned thin film materials.

Figure 3A:
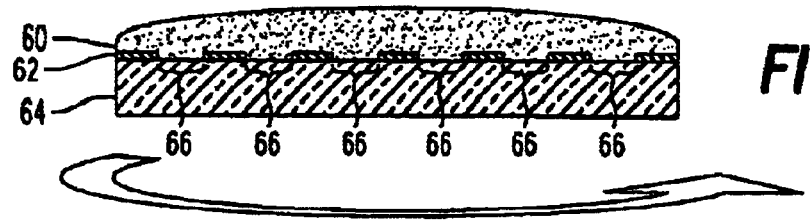
FIG. 3A depicts spin-coating on a substrate patterned with a self-assembled molecular monolayer to form a discontinuous thin film in a geometry defined by the inverse of the monolayer.
Figure 3B:
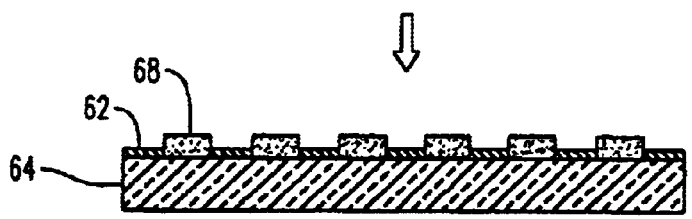
FIG. 3B depicts substrate having thereon a patterned thin film after the substrate is spun.

FIG. 3A illustrates the solution deposition technique known as spin-coating. FIG. 3B depicts substrate having thereon a patterned thin film after the substrate is spun.

Following the deposition and patterning of the self-assembled molecular monolayer, a solution containing the desired thin film material 60, or a precursor, is flooded across the entire substrate surface 64, pre-patterned with a self-assembled molecular monolayer 62. The tail group of the self-assembled molecular monolayer 62 is chosen to provide chemical differentiation, for example hydrophobicity versus hydrophilicity, between patterned 62 and unpatterned 66 regions of the solid substrate surface 64. The chemical differentiation across the substrate surface, between 62 and 66, affects the wettability of the solution deposited thin film so that upon spinning, the material deposits only in unpatterned regions 66, forming a patterned thin film 68 on the substrate surface 64. The thickness of the patterned thin film material 68 is controlled by choosing the concentration of the thin film material or its precursors in the solution 60 and the rate of revolution of the spinning substrate 64.

The process shown in FIG. 3A can be operated in an inverse mode to control the deposition of the thin film. For example, the self-assembled molecular monolayer may be chosen to increase the wettability of the solution deposited thin film in contrast to the chemical nature of the native substrate surface or a substrate surface patterned with a second, spatially offset, molecular layer that decreases the wettability of the solution deposited thin film. In this case, the spin-coated thin film deposits on top of the self-assembled molecular layer and not on unpatterned regions of the substrate surface or the regions patterned with the second self-assembled molecular layer.

Figure 3C:
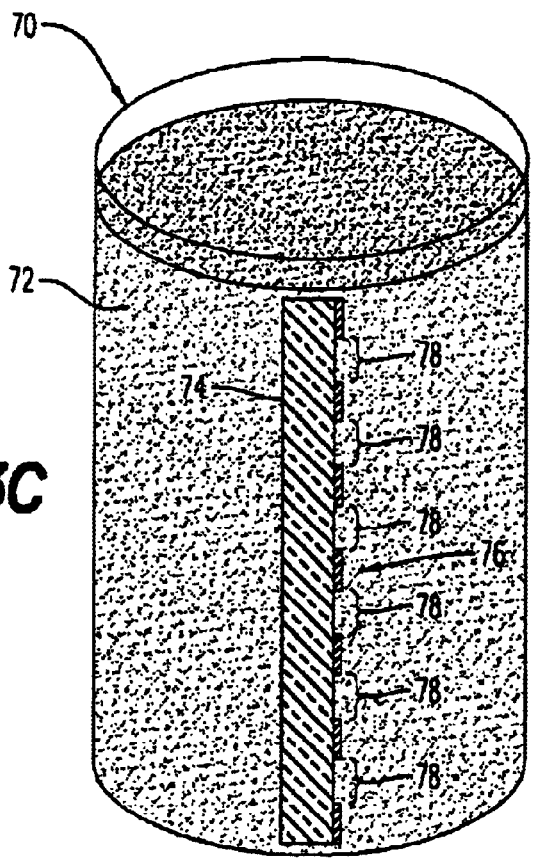
FIG. 3C depicts dip-coating on a substrate patterned with a self-assembled molecular monolayer to form a discontinuous thin film in a geometry defined by the inverse of the monolayer.

FIG. 3C illustrates the solution deposition technique known as immersion coating, or dip-coating. Following the deposition and patterning of the self-assembled molecular monolayer, dish 70 is filled with a solution containing the desired thin film material or its precursors 72 and the substrate 74 is immersed in solution 72.

Figure 3D:
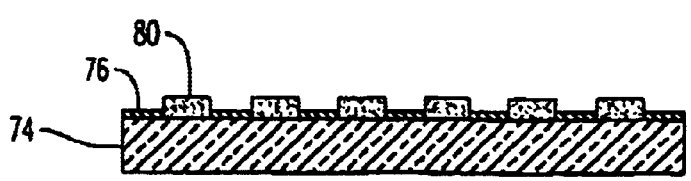
FIG. 3D depicts substrate having thereon a patterned thin film after it is withdrawn from solution.

The tail group of the self assembled molecular layer 76 is chosen to provide chemical differentiation between patterned 76 and unpatterned 78 regions of the solid substrate surface 74. As in spin-coating case, the tail group of the self assembled molecular layer 76 affects the wettability of the dip-coated thin film. The substrate 74 is withdrawn from solution 72 leaving behind material only in unpatterned regions 78, forming a patterned thin film 80 on the substrate surface 74, as can be seen in FIG. 3D.

In immersion-coating, the thickness of the patterned thin film material 80 is controlled by choosing the concentration of the thin film material or its precursors in solution 72 and the rate of substrate 74 removal from solution 72. In this case, the patterned thin film is deposited in regions free from the self-assembled molecular layer 78. As in the case of spin-coating described above, a self-assembled molecular layer can be chosen to have a tail group that increases the wettability of the dip-coated thin film in contrast to the native substrate surface or a second, spatially offset, molecular monolayer.

Figure 4:
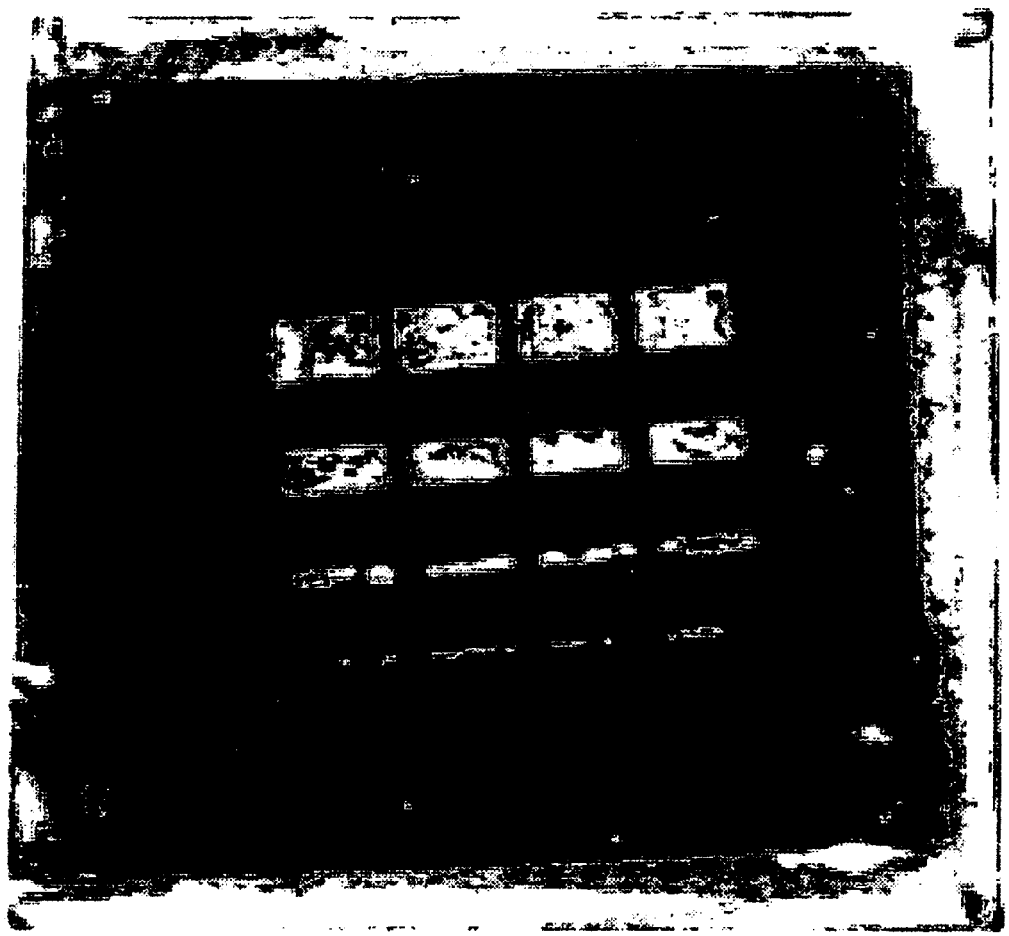
FIG. 4 is a copy of a photograph of a patterned thin film of organic-inorganic hybrid deposited by spin-coating on a substrate patterned with a self-assembled molecular monolayer deposited by microcontact printing.

FIG. 4 shows a photograph of a patterned thin film of organic-inorganic hybrid material represented by the formula $(C_6H_5C_2H_4NH_3)_2SnI_4$ deposited by spin-coating on a patterned self-assembled molecular monolayer. The organic molecular species is deposited by microcontact printing to form a self-assembled molecular monolayer on the surface of a solid substrate. Spin-coating on the substrate patterned with a self-assembled molecular monolayer forms a discontinuous thin film of the organic-inorganic hybrid in a geometry defined by the inverse of the monolayer.

EXAMPLE 1

A template having an exposed and developed photoresist pattern was fabricated by photolithography. A 10:1 (w:w or v:v) mixture of PDMS-Sylgard Silicone Elastomer 184 and Sylgard Curing Agent 184 (Dow Corning Corp., Midland, Mich.) was degassed under vacuum for about 10 minutes, then the mixture was poured over the template. The PDMS cured at 65° C. within 60 minutes to produce an elastomeric stamp. After cooling to room temperature, the PDMS stamp was carefully peeled from the template. A thermally grown silicon dioxide surface on an n-type silicon wafer was patterned with a self-assembled molecular monolayer of octadecyl phosphonic acid by the elastomeric stamp using microcontact printing, as illustrated in FIGS. 1A–C.

The phosphonic acid terminal head group acts to bind to the hydrophillic silicon dioxide surface and the long octadecyl chain imparts a contrasting hydrophobic surface. Patterning the silicon dioxide surface with octadecylphosphonic acid provides a substrate surface with contrasting hydrophilic and hydrophobic regions.

A solution of the organic-inorganic hybrid material, phenethylammonium tin iodide having the formula $(C_6H_5C_2H_4NH_3)_2SnI_4$ in methanol was flooded across the pre-patterned substrate surface. The substrate covered in a pool of solution was spun forming a discontinuous, polycrystalline thin film of the organic-inorganic hybrid material.

As shown in the photograph (FIG. 4), the deposited organic-inorganic hybrid material appears, in reflection, green on the substrate surface. The hybrid deposits on the hydrophilic, uncoated regions of the silicon dioxide surface and not on the hydrophobic regions where the self-assembled molecular monolayer, octadecylphosphonic acid, was stamped. The pattern of the deposited thin film was defined by the topography of the elastomeric stamp used to deposit the patterned self-assembled molecular monolayer.

EXAMPLE 2

A silicon dioxide surface on an n-type silicon wafer was patterned by microcontact printing with a self-assembled monolayer of the fluorinated silane having the formula (tridecafluoro 1,1,2,2-tetrahydrooctyl)trichlorosilane. The trichlorosilane head group acts to bind to the hydrophilic silicon dioxide surface and the fluorinated hydrocarbon tail group imparts a contrasting hydrophobic surface, akin to Teflon. The chemical differentiation across the substrate surface was similarly used to define the pattern of deposited thin films of various organic-inorganic hybrid materials.

Each of the following organic-inorganic hybrid materials were used:

(1) phenethylammonium tin iodide having the formula $(C_6H_5C_2H_4NH_3)_2SnI_4$ from a solution in methanol;

(2) butylammonium methylammonium tin iodide having the formula $(C_4H_9NH_3)_2CH_3NH_3Sn_2I_7$ from a solution in N,N-dimethylformamide;

(3) phenethylammonium methylammonium tin iodide having the formula $(C_6H_5C_2H_4NH_3)_2CH_3NH_3Sn_2I_7$ from a solution in N,N-dimethylformamide; and (4) butanediammonium tin iodide having the formula $(H_3NC_4H_8NH_3)_2SnI_4$ from a solution in methanol.

These examples of organic-inorganic hybrid materials are molecular-scale composites of organic and inorganic layers. The flexibility in the chemistry of the hybrid materials allows the composition of the organic and inorganic layers and the dimensionality, i.e., number of inorganic layers per organic layer, to be tailored.

Organic-inorganic hybrid materials, as above, form the active semiconducting channel in thin film transistors, as described in the copending U.S. patent application, Ser. No. 09/261,515, filed on Mar. 3, 1999, the contents of which are incorporated herein by reference in its entirety.

The organic-inorganic hybrid materials also form the active semiconducting channel in the emissive layers in light-emitting diodes, as described in the previously incorporated M. Era et al., Appl. Phys. Lett., 65, 676(1994).

EXAMPLE 3

As silicon dioxide surface on an n-type silicon wafer is patterned by microcontact printing with a self-assembled monolayer of (tridecafluoro 1,1,2,2-tetrahydrooctyl) trichlorosilane (a fluorinated silane).

The chemical differentiation on the substrate surface is used to define the pattern of deposited thin film of the copolymer polymethyl methacrylate/methyl methacrylate (PMMA/MMA) from a solution in ethyl lactate. PMMA/MMA is used as an insulator in electrical applications and as a material to prepare microlenses for optical applications. It is also a resist for e-beam lithography.

The method of the present invention can be used to define large features in resist and e-beam lithography can be used to pattern small features. The hybrid technique resulting from the combination of these methods allows patterning of both large and small features on the substrate thereby reducing the time and the overall cost of patterning relative to using e-beam lithography alone.

EXAMPLE 4

As silicon dioxide surface on an n-type silicon wafer was patterned by microcontact printing with a self-assembled monolayer of (tridecafluoro-1,1,2,2-tetrahydrooctyl) trichlorosilane. Chemically differentiated substrate surface was used to define the pattern of deposited thin film of positive, deep UV photoresist UV82, produced by the Shipley Co., which employs ethyl lactate as the casting solvent.

EXAMPLE 5

As silicon dioxide surface on an n-type silicon wafer was patterned by microcontact printing with a self-assembled monolayer of (tridecafluoro 1,1,2,2-tetrahydrooctyl) trichlorosilane. The chemically differentiated substrate surface was used to define the pattern of a thin film of 50 nm silica particles deposited from a colloidal suspension (Highlink OG 113-53), produced by Clariant Corp, which incorporates isopropanol and hexamethylene diacrylate as spin-casting solvents.

Silica particles and other high index particles can be used as photonic band gap materials to control the propagation and diffraction of light, and as lenses. Similarly, thin films of smaller nanocrystalline materials, which may be for example semiconducting, metallic, superconducting, ferroelectric, and magnetic, can be patterned.

These materials can be patterned for applications such as light-emitting diodes, thin film transistors, photovoltaic devices, ferroelectric memory applications and storage devices.

EXAMPLE 6

A silicon dioxide surface on an n-type silicon wafer is patterned by microcontact printing with a self-assembled monolayer of (tridecafluoro 1,1,2,2-tetrahydrooctyl) trichlorosilane. The chemically differentiated substrate surface is used to define the pattern of a deposited thin film of the metallo-organic complex, tin 2-ethylhexanoate from a toluene solution. Tin 2-ethyl hexanoate is one example of a metallo-organic complex and is commonly used as a precursor for metallo-organic deposition of the transparent semiconductor $SnO_2$. The metallo-organic thin film is annealed at elevated temperatures, removing the organic component and forming a crystallized metal-oxide thin film. Other metallo-organic complexes and their combinations may be similarly deposited and annealed to prepare metal and metal oxide thin films depending on the atmosphere during annealing. These materials are for example metallic, dielectric, ferroelectric, piezoelectric, and superconducting and are used in applications such as metal wires or contacts, layers in capacitors, waveguiding structures, components in memory cells, and components in superconducting devices.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A method of forming a patterned thin film comprising:
   depositing a thin film material on a surface of a substrate having thereon a patterned underlayer of a self-assembled monolayer;
   wherein said self-assembled monolayer is prepared by a process comprising the steps of: providing a stamp having a surface; coating said surface of said stamp with an organic molecular species to produce a coated surface, said organic molecular species having a head functional group capable of interacting with said surface of said substrate, and a tail group for chemical differentiation of said patterned and unpatterned regions of said coated surface; placing said coated surface in contact with said substrate for a length of time sufficient to transfer said self-assembled monolayer of said organic molecular species from said stamp to said substrate; and removing said stamp; and
   wherein said organic molecular species comprises (tridecafluoro-1,1,2,2-tetrahydrooctyl)trichlorosilane.

2. The method of claim 1, wherein said thin film material is selected from the group consisting of: an organic molecule, a short-chain organic oligomer, a long-chain organic polymer, a photoresist, an organic-inorganic hybrid material, a metallo-organic complex, a nanoparticle of metal, a nanoparticle of metal oxide, a nanoparticle of semiconductor, a silica particle, an inorganic salt, and a mixture thereof, on a surface of a substrate having thereon a patterned underlayer of a self-assembled monolayer.

3. The method of claim 1, wherein said substrate is selected from the group consisting of: a metal, a metal oxide, a semiconductor, a metal alloy, a semiconductor alloy, a polymer, an organic solid, and a combination thereof.

4. The method of claim 1, wherein said substrate is an irregularly shaped substrate.

5. The method of claim 1, wherein said substrate is a solid substrate having a flexible, curved or planar geometry.

6. The method of claim 1, wherein said stamp is an elastomeric stamp.

7. The method of claim 1, wherein said stamp has at least one indented and at least one non-indented surface.

8. The method of claim 7, wherein said transfer is in a pattern defined by the topography of said stamp.

9. A method of forming a patterned thin film, said method comprising:
   depositing a thin film material selected from the group consisting of: an organic molecule, a short-chain organic oligomer, a long-chain organic polymer, a photoresist, an organic-inorganic hybrid material, a metallo-organic complex, a nanoparticle of metal, a nanoparticle of metal oxide, a nanoparticle of semiconductor, a silica particle, an inorganic salt, and a mixture thereof, on a surface of a substrate having thereon a patterned underlayer of a self-assembled monolayer having patterned and unpatterned regions prepared by a process comprising the steps of:

providing a stamp having a surface;

coating said surface of said stamp with an organic molecular species comprising (tridecafluoro-1,1,2,2-tetrahydrooctyl)trichlorosilane to produce a coated surface, said organic molecular species having a head functional group capable of interacting with said surface of said substrate, and a tail group for chemical differentiation of said patterned and unpatterned regions of said coated surface;

placing said coated surface in contact with said substrate for a length of time sufficient to transfer said self-assembled monolayer of said organic molecular species from said stamp to said substrate; and removing said stamp.

* * * * *